(12) United States Patent
Mochizuki et al.

(10) Patent No.: US 10,096,526 B2
(45) Date of Patent: Oct. 9, 2018

(54) DIE BONDER AND BONDING METHOD

(75) Inventors: Masayuki Mochizuki, Kumagaya (JP); Hiroshi Maki, Kumagaya (JP); Yukio Tani, Kumagaya (JP); Takehito Mochizuki, Kumagaya (JP)

(73) Assignee: Fasford Technology Co., Ltd., Minami-Alps (JP)

( * ) Notice: Subject to any disclaimer, the term of this patent is extended or adjusted under 35 U.S.C. 154(b) by 264 days.

(21) Appl. No.: 13/585,900

(22) Filed: Aug. 15, 2012

(65) Prior Publication Data
US 2013/0068824 A1    Mar. 21, 2013

(30) Foreign Application Priority Data
Sep. 16, 2011   (JP) .................................. 2011-203673

(51) Int. Cl.
H01L 21/66    (2006.01)
H01L 21/67    (2006.01)
H01L 21/68    (2006.01)
H01L 23/00    (2006.01)

(52) U.S. Cl.
CPC ........ *H01L 22/20* (2013.01); *H01L 21/67132* (2013.01); *H01L 21/67144* (2013.01); *H01L 21/681* (2013.01); *H01L 24/75* (2013.01); *H01L 24/83* (2013.01); *H01L 22/14* (2013.01); *H01L 2224/757* (2013.01); *H01L 2224/759* (2013.01);
(Continued)

(58) Field of Classification Search
CPC ............... H01L 21/67; H01L 21/67132; H01L 21/67242; H01L 21/67271; H01L 21/67276; H01L 21/677; H01L 21/67721; H01L 21/6773
See application file for complete search history.

(56) References Cited

U.S. PATENT DOCUMENTS

| 5,979,739 A | * | 11/1999 | Jin et al. ........................ 228/6.2 |
| 6,140,151 A | * | 10/2000 | Akram ................ H01L 21/6836 |
|             |   |         | 438/113 |
| 6,984,533 B1 | * | 1/2006 | Regos et al. .................... 438/15 |

(Continued)

FOREIGN PATENT DOCUMENTS

| JP | 7-193093 A | 7/1995 |
| JP | 09-008068 | 1/1997 |

(Continued)

OTHER PUBLICATIONS

Machine generated English translation for JP07-193093A.*

(Continued)

*Primary Examiner* — Kevin E Yoon
*Assistant Examiner* — Jacky Yuen
(74) *Attorney, Agent, or Firm* — Crowell & Moring LLP

(57) ABSTRACT

A bonding method of a die bonder with a single conveyance lane and a single bonding head, or a plurality of conveyance lanes and a plurality of bonding heads includes the steps of generating a classification map of class dies with different electric properties on the wafer, which are classified in accordance with a plurality of grades, picking up the die from the wafer, bonding the die onto a substrate or the die using a bonding head, conveying a class substrate corresponding to the class die on the conveyance lane in a unit of the class substrate, and further bonding the class die to the corresponding class substrate based on the classification map.

10 Claims, 6 Drawing Sheets

(52) U.S. Cl.
CPC .. *H01L 2224/7565* (2013.01); *H01L 2224/83* (2013.01)

(56) References Cited

U.S. PATENT DOCUMENTS

| | | | |
|---|---|---|---|
| 7,547,575 B2 * | 6/2009 | Tong et al. | 438/107 |
| 7,568,606 B2 * | 8/2009 | Wong et al. | 228/43 |
| 2004/0244915 A1 * | 12/2004 | Lam et al. | 156/510 |
| 2005/0130333 A1 * | 6/2005 | Zhong et al. | 438/16 |
| 2011/0079361 A1 * | 4/2011 | Park et al. | 156/541 |

FOREIGN PATENT DOCUMENTS

| | | | |
|---|---|---|---|
| JP | 09017812 A | * | 1/1997 |
| JP | 11204670 A | * | 7/1999 |
| JP | 2007-95737 A | | 4/2007 |
| JP | 2008-251771 A | | 10/2008 |

OTHER PUBLICATIONS

Machine Translation of JP H09-008068 (Jan. 10, 1997).*
Japanese Office Action with English Translation dated Jun. 9, 2015 (6 pages).
Translation of Japanese-language Office Action issued in counterpart Japanese Application No. 2015-186355 dated May 24, 2016 (6 pages).
Japanese-language Office Action issued in counterpart Japanese Application No. 2017-073594 dated Jan. 9, 2018 with English translation (5 pages).

\* cited by examiner

DIE BONDER AND BONDING METHOD

BACKGROUND OF THE INVENTION

The present invention relates to a die bonder and a bonding method, and more particularly, to a die bonder and a bonding method which allow processing of a wafer with a plurality of grades without removing the wafer.

A process of assembling a package by mounting a die (semiconductor chip) (hereinafter simply referred to as a die) onto the substrate such as a wiring substrate and a lead frame includes a step of separating a die from a semiconductor wafer (hereinafter simply referred to as a wafer), and a step of bonding the separated die onto the substrate.

The dies to be picked up on the wafer are classified into a plurality of grades in accordance with electric properties, which are stored in a memory of a control unit. When mounting the dies with a plurality of grades onto the substrate, the die bonder corresponding to the grade has to be selected from the different die bonders and exchanged, which may take time, and reduce productivity. If the wafer that has been once picked up is removed from the die bonder, the remaining dies are brought into contact with one another because of loosened tensile force of the sheet, which may cause the risk of breaking and reduced yield.

The technology for solution of the above-described problem is disclosed in JP-A No. 07-193093, which allows the bonding head to bond the dies with a plurality of grades for each of a plurality of lanes that convey the lead frame.

SUMMARY OF THE INVENTION

There has been a demand for processing the wafer with a plurality of grades without being removed for the respective die bonders, for example, a die bonder with a single conveyance lane and a single bonding head as a first case, and a die bonder with a plurality of conveyance lanes and a plurality of bonding heads as a second case in conformity to the recent requirement of improved productivity.

The technology disclosed in JP-A No. 07-193093 is not intended to fulfill the needs as described above, or discloses no specific solution.

The present invention provides a die bonder with a first conveyance lane and a first bonding head, and a bonding method capable of performing a grade processing of the wafer that has dies with a plurality of grades without removing the wafer.

The present invention further provides a die bonder with a plurality of conveyance lanes and a plurality of bonding heads, and a bonding method capable of performing a grade processing of the wafer that has dies with a plurality of grades without removing the wafer.

The present invention at least provides characteristics as described below.

A first characteristic of the present invention is a die bonder or a bonding method of a die bonder with a single unit of a conveyance lane and a single unit of a bonding head, or a plurality of conveyance lanes and a plurality of bonding heads, which generates a classification map of class dies of a wafer, which have a plurality of grades in accordance with different electric properties, picking up the die from the wafer, bonding the die picked up by the bonding head onto a substrate, or the already bonded die, and conveying each of class substrates to which the corresponding class die is bonded on the conveyance lane to a bonding region in a unit of the class substrate, and executes a classification control which bonds the class die to the corresponding class substrate based on the classification map.

As a second characteristic of the present invention, the number of a plurality of grades is set to two.

As a third characteristic, the die bonder includes a single unit of the conveyance lane and a single unit of the bonding head. The classification control is executed by supplying at least one of a plurality of class substrates from an end of the conveyance lane, and, after bonding, returning the class substrates to the end for carry out.

As a fourth characteristic of the present invention, the die bonder includes a plurality of the conveyance lanes and a plurality of the bonding heads. The classification control unit supplies different class substrates to at least one of a plurality of the conveyance lanes from both ends, and returns the different class substrates to supply sides for carry out.

As a fifth characteristic of the present invention, the number of a plurality of the grades is set to three. The classification control step conveys two substrate conveyance pallets in series, each of which has a plurality of the class substrates to which the largest number of the class dies are bonded on the conveyance lane that conveys the largest number of class dies for carrying out from one end to the other end of the conveyance lane.

As a sixth characteristic of the present invention, four-class dies with four grades are provided, or the wafer has the four-class dies as two types of the dies with two grades, respectively. The classification control unit supplies the four-class substrates corresponding to the four-class dies from four ends of the two conveyance lanes separately to the conveyance lanes, and returns the four-class substrates to the supply sides for carry out.

As a seventh characteristic of the present invention, each number of a plurality of grades, conveyance lanes, and bonding heads is set to two. The classification control unit conveys two substrate conveyance pallets in series, each of which has a plurality of the class substrates to which the largest number of class dies are bonded from one end to the other end of the conveyance lane which conveys the largest number of the class dies to be bonded.

As an eighth characteristic of the present invention, after bonding the largest number of the class dies to be bonded, the classification control unit bonds the other class dies.

As a ninth characteristic of the present invention, the classification control unit picks up the dies from those easy to be picked up, or picks up the dies so as to establish predetermined rates among the respective classes with respect to a predetermined time or a predetermined number of dies.

As a tenth characteristic of the present invention, when all the class substrates on one of the two substrate conveyance pallets to be conveyed in series, which is closer to the other end are bonded, the classification control unit moves the substrate conveyance pallet closer to the one end to a position of the substrate conveyance pallet which is closer to the other end.

The present invention provides a bonding method of a die bonder with a single unit of a conveyance lane and a single unit of a bonding head, which is capable of performing a grade processing of a wafer with a plurality of grades without removing the wafer.

The present invention provides a bonding method of a die bonder with a plurality of conveyance lanes and a plurality of bonding heads, which is capable of performing a grade processing of a wafer with a plurality of grades without removing the wafer.

DESCRIPTION OF THE PREFERRED EMBODIMENTS

Figure 1:
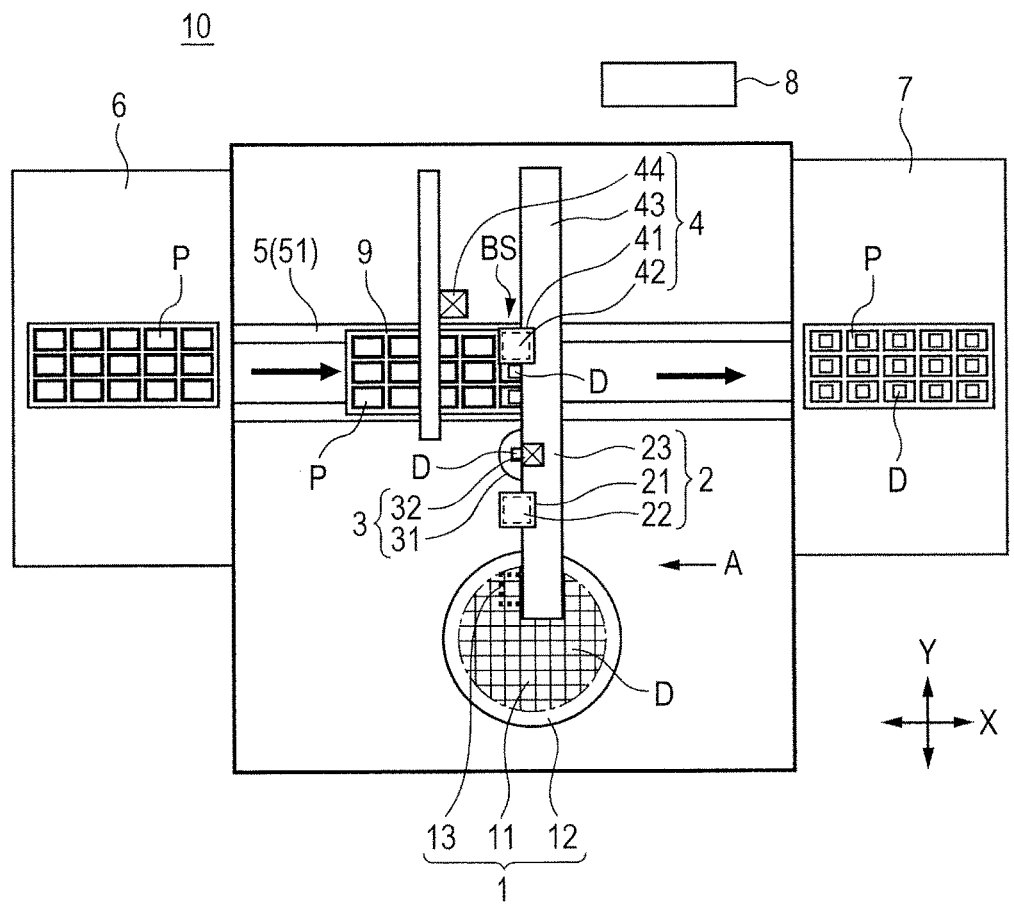
FIG. 1 is a top view schematically showing a die bonder according to a first embodiment of the present invention.

Embodiments of the present invention will be described referring to the drawings.

(First Embodiment)

Figure 2:
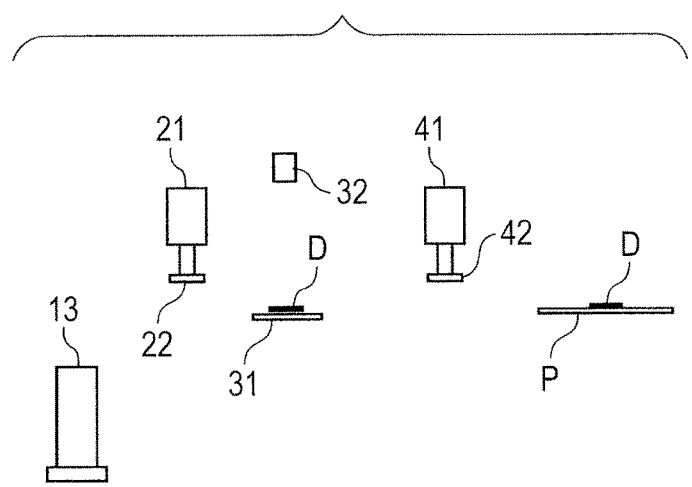
FIG. 2 is an explanatory view schematically representing a structure and an operation of the die bonder seen from an arrow mark A shown in FIG. 1.

FIG. 1 is a top view schematically showing a die bonder 10 according to a first embodiment of the present invention. FIG. 2 is an explanatory view schematically showing a structure and an operation of the die bonder seen from an arrow mark A of FIG. 1.

The die bonder 10 includes a single conveyance lane and a single bonding head. The die bonder 10 is mainly formed of a die supply unit 1 that supplies a die D to be mounted onto a substrate P, a pickup unit 2 that picks up the die from the die supply unit 1, an alignment unit 3 that intermediately places the picked up die D, a bonding unit 4 that picks up the die D on the alignment unit 3 and bonds to the substrate P or the die D that has been already bonded, a conveyance unit 5 that conveys the substrate P to a mount position, substrate supply/carry-out units 6 and 7 that supply the substrate to the conveyance unit 5 and receive the mounted substrate P, and a control unit 8 that monitors and controls operations of the respective units.

The die supply unit 1 includes a wafer holding base 12 that holds a wafer 11 having dies D with a plurality of grades, and a thrust-up unit 13 indicated by a dotted line, which thrusts the die D upward from the wafer 11. The die supply unit 1 moves in an XY direction driven by a not shown drive unit so that the die D to be picked up is moved to a position of the thrust-up unit 13.

The pickup unit 2 includes a collet 22 (see FIG. 2) that holds the die D thrust upward by the thrust-up unit 13 at the leading end by sucking, a pickup head 21 that picks up the die D so as to be placed on the alignment unit 3, and a Y drive unit 23 of the pickup head, which moves the pickup head 21 in the Y direction. The pickup operation is performed based on a classification map indicating grades of the dies with a plurality of different electric properties on the wafer 11. The classification map is preliminarily stored in the control unit 8. The pickup head 21 includes not shown drive units that elevate, rotate, and further move the collet 22 in the X direction.

The alignment unit 3 includes an alignment stage 31 that allows the die D to be temporarily placed, and a stage recognition camera 32 for recognition of the die D on the alignment stage 31.

The bonding unit 4 includes a bonding head 41 that has the same structure as that of the pickup head, and picks up the die D from the alignment stage 31 so as to be bonded to the substrate P that has been carried in, a collet 42 that is attached to the leading end of the bonding head 41 so as to hold the die D by sucking, a Y drive unit 43 that moves the bonding head 41 in the Y direction, and a substrate recognition camera 44 that picks up an image of a position recognition mark (not shown) of the substrate P that has been carried in, and recognizes the bonding position of the die D to be bonded.

The above-configured bonding head 41 corrects the pickup position and posture based on the image pickup data of the stage recognition camera 32, and picks up the die D from the alignment stage 31 to bond the die D to the substrate P based on the image pickup data of the substrate recognition camera 44.

The conveyance unit 5 includes a conveyance lane 51 provided with two conveyance chutes for a substrate conveyance pallet 9 having one or a plurality of substrates P (referring to FIG. 1, 15 substrates) placed thereon. For example, the substrate conveyance pallet 9 is moved on a not shown conveyance belt provided for the two conveyance chute.

The aforementioned structure allows the substrate conveyance pallet 9 to place the substrate P at the substrate supply/carry-out units 6 and 7, to move along the conveyance chutes to the bonding position, and to move or return to the substrate supply/carry-out units 6 and 7 after bonding for carry out of the substrate P.

According to the first embodiment, the alignment stage 31 is provided for reducing the moving distance of the bonding head 41 and the processing time. The present invention may be configured to allow the bonding head 41 to directly pick up the die D from the wafer while omitting the alignment stage 31.

The region where the die D is bonded by the bonding head will be hereinafter referred to as a "bonding stage BS". A plurality of bonding stages will be referred to as BS1, BS2, and the like. The grades of the dies D will be referred to as class 1 die D1, class 2 die D2, and the like, and the corresponding substrate will be referred to as class 1 substrate P1, class 2 substrate P2, and the like. The substrate on which the die is not yet mounted will be expressed as a suffix m, and the substrate on which the dies are already mounted will be expressed as a suffix g, respectively. The die or the substrate will be collectively referred to simply as D and P, respectively.

Generally, there are the largest numbers of highly graded conforming dies. The number of the dies will be sharply reduced as the corresponding grade is lowered. The conforming dies will be referred to as class 1 die D1, class 2 die D2, and the like in order from the highest grade. The wafer may have a defective die which is not subjected to the grade processing.

The first embodiment includes a classification control unit or a classification control process step achieves a grade processing which picks up the die D from the wafer 11 having dies with two grades, that is, the class 1 die D1 and the class 2 die D2 in reference to the classification map, supplies the class 1 substrate P1 and the class 2 substrate P2 corresponding to the die classes to the conveyance lane 51 so that the die D is bonded to the substrate P that has been carried in, and returns at least one of the class dies D (class substrate P) to the supply side for carry out.

Firstly, when using the die bonder with the single conveyance lane and the single bonding head, the wafer having the dies with a plurality of grades may be subjected to the grade processing without removing the wafer. Secondly, the bonded substrate P may be classified for each class without being mixed up, which ensures supply of the substrates P for each grade.

(First Example)

Figure 3:
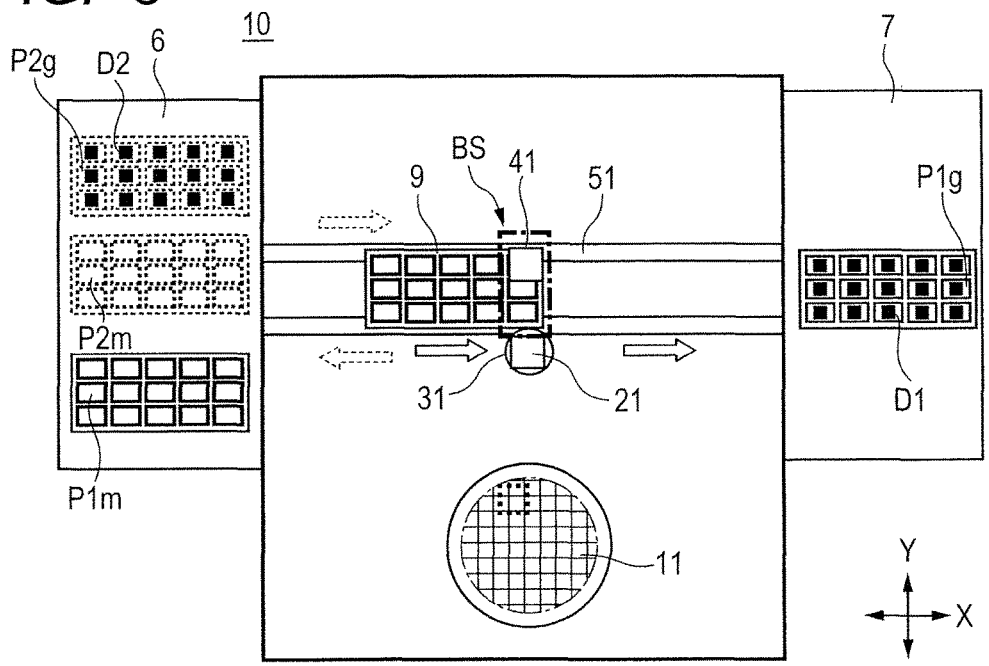
FIG. 3 is a view representing a structure and an operation of a classification control unit as a first example according to a first embodiment of the present invention.

FIG. 3 is a view representing a structure and an operation of the classification control unit as a first example according to the first embodiment of the present invention. FIG. 3 shows codes of minimum necessary structures for the purpose of avoiding complexity.

According to the first example, the class 1 die D1 and the class 2 die D2 from the wafer 11 with two grades are bonded to the class 1 substrate P1 and the class 2 substrate P2, respectively. The class 1 substrate P1 indicated by the solid line is supplied from the substrate supply/carry-out unit 6 to the substrate supply/carry-out unit 7 as indicated by the solid arrow mark. The class 2 substrate P2 indicated by the broken line is supplied from the substrate supply/carry-out unit 6 as indicated by the broken arrow mark for returning and carrying out the substrate to the substrate supply/carry-out unit 6 again. Referring to FIG. 3, a black square on the substrate denotes the die D that has been already mounted on the substrate. Generally, the class 1 die D1 has the higher grade and a larger amount than those of the class 2 die D2. The class 1 die D1 accounts for approximately 90%, and the class 2 die D2 accounts for approximately 10%.

Figure 4:
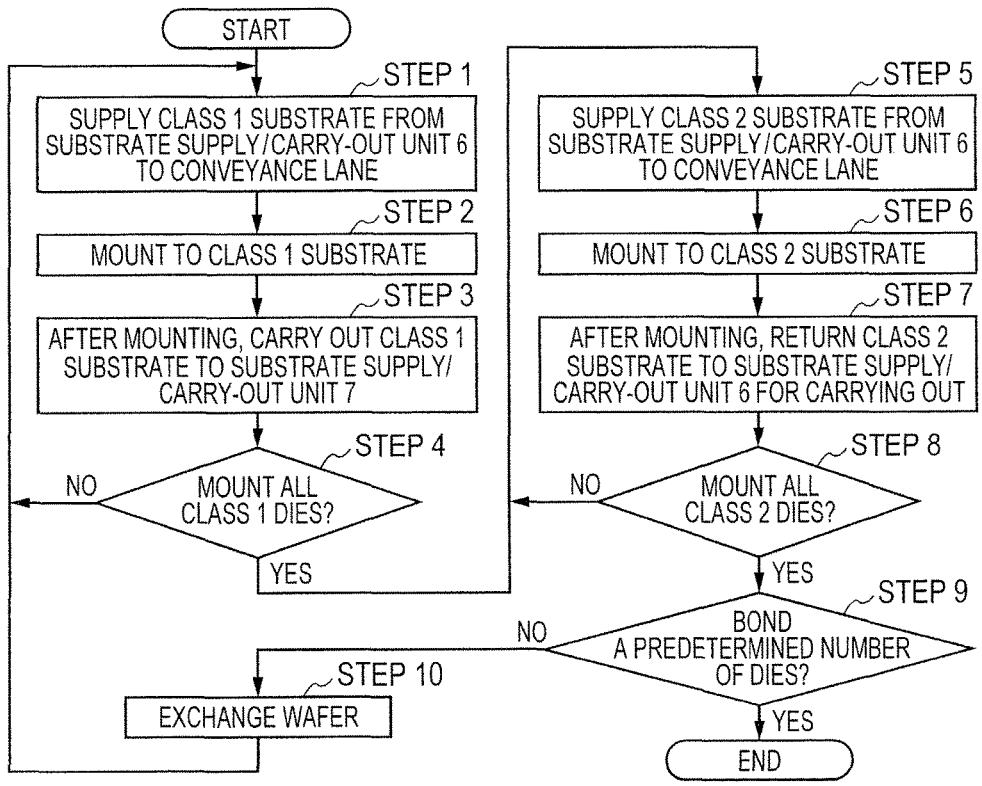
FIG. 4 is a flowchart representing a process flow executed by the classification control unit according to the first example shown in FIG. 3.

FIG. 4 is a flowchart representing process steps executed by the classification control unit according to the first example shown in FIG. 3.

The substrate conveyance pallet 9 provided with a plurality of class 1 substrates P1 that have not been mounted among the class substrates P, that is, class 1 substrates P1$m$ (15 substrates as shown in FIG. 3) is supplied from the substrate supply/carry-out unit 6 to the conveyance lane 51 (step 1).

Then the substrate conveyance pallet 9 is moved to the bonding stage BS where the class 1 dies D1 are individually mounted onto the corresponding class 1 substrates P1 on the substrate conveyance pallet 9 (step 2). Mounting is performed by controlling the position of the wafer 11 based on the classification map stored in the control unit 8. The class 1 die D1 is picked up by the pickup head 21 for placement on the alignment stage 31. The bonding head 41 picks up the class 1 die D1 on the alignment stage 31 so as to be bonded to the unmounted class 1 substrate P1$m$. The aforementioned operation is performed for each of the class 1 substrates P1 on the substrate conveyance pallet 9. FIG. 3 illustrates that the bonding head 41 performs bonding on the unmounted first class 1 substrate P1$m$, and the pickup head 21 places the class 1 die D1 to be mounted next on the bonding head 41.

The substrate conveyance pallet 9 with the class 1 substrates P1$g$ mounted with the class 1 dies D1 is carried out to the substrate supply/carry-out unit 7 (step 3). The process from steps 1 to 3 is repeatedly executed until all the class 1 dies D1 on the wafer 11 are mounted (step 4). When all the class 1 dies D1 to be processed are mounted, the class 2 die D2 will be subjected to the processing.

The class 2 die D2 will be subjected to the same process as the one including steps 1, 2 and the like for the class 1 die D1, for example, the unmounted class substrate P2$m$ indicated by the broken line is supplied from the substrate supply/carry-out unit 6 (steps 5, 6). Then unlike the process for the class 1 die D1, the substrate conveyance pallet 9 with the class 2 substrates P2$g$ mounted with the class 2 dies D2 is returned to the substrate supply/carry-out unit 6 for carry out (step 7). The process from steps 5 to 7 is repeatedly executed until all the class 2 dies D2 on the wafer 11 are mounted (step 4).

It is then judged whether a predetermined number of dies have been mounted (step 9). If the judgment is negative, the wafer is replaced with a new wafer (step 10) so that the process from steps 1 to 9 is repeatedly executed. If the judgment is positive, the process ends.

(Second Example)

Figure 5:
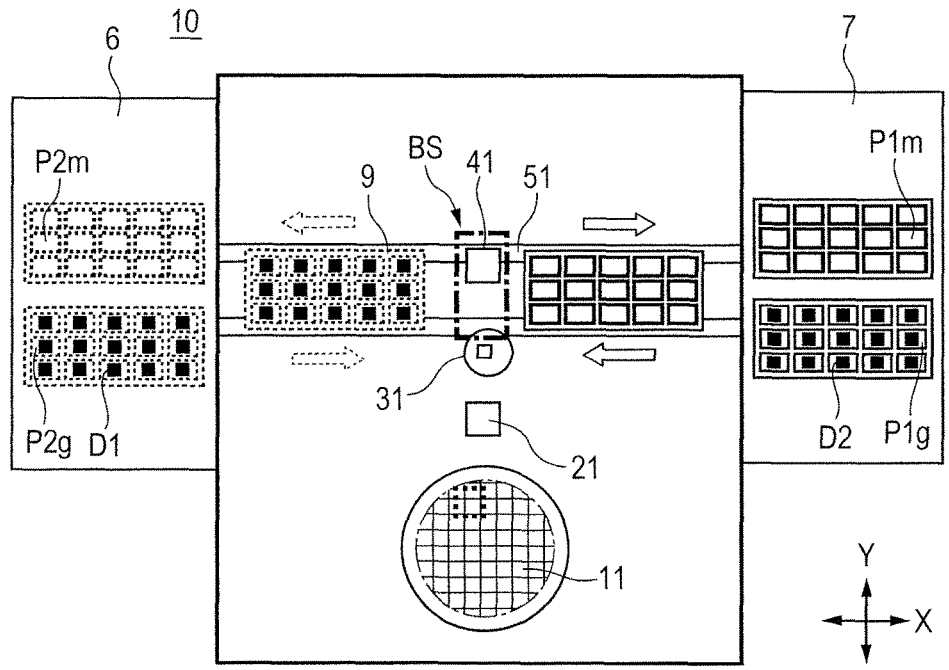
FIG. 5 is a view representing a structure and an operation of the classification control unit as a second example according to the first embodiment of the present invention.

FIG. 5 is a view representing a structure and an operation of the classification control unit as a second example according to the first embodiment of the present invention. Likewise FIG. 3, FIG. 5 shows codes of minimum necessary structures for the purpose of avoiding complexity.

Unlike the first example having the class 1 substrate P1 supplied from the substrate supply/carry-out unit 6 to the substrate supply/carry-out unit 7, in the second example as indicated by the solid arrow mark, the class 1 substrate P1 is supplied from the substrate supply/carry-out unit 7, and returned thereto for carry out. According to the second example, the class 1 substrate P1 and the class 2 substrate P2 are supplied from the different substrate supply/carry-out units, and they are returned to the same substrate supply/carry-out unit which has supplied the substrate P for carry out.

Figure 6:
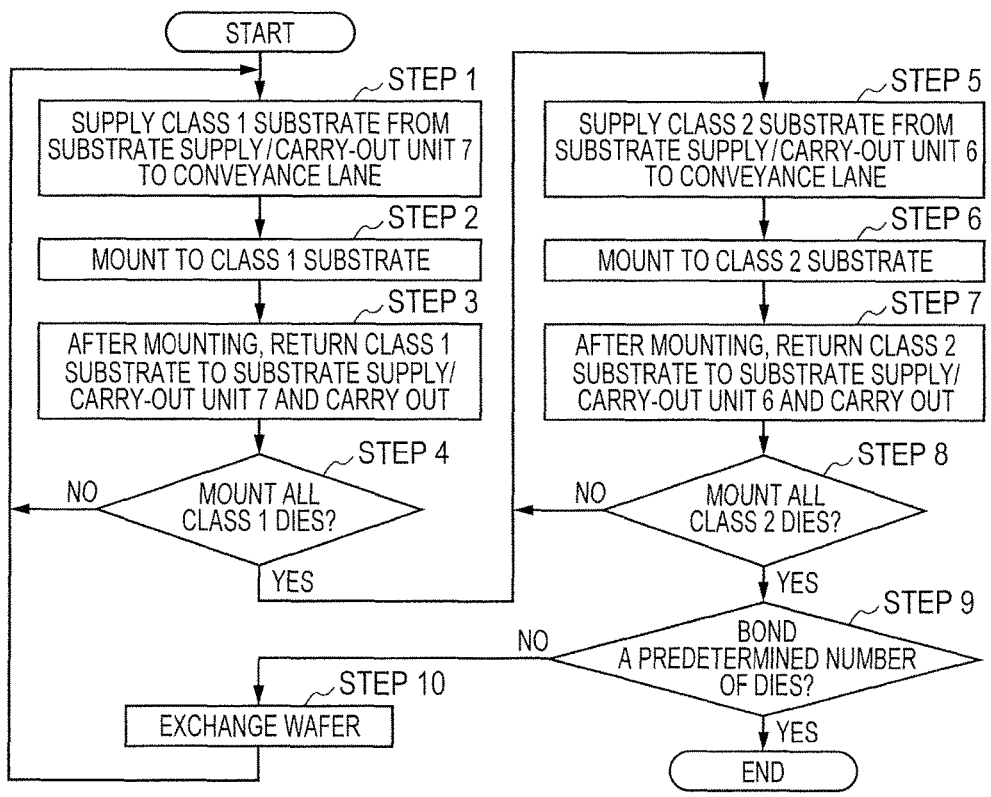
FIG. 6 is a flowchart representing a process flow executed by the classification control unit according to the second example shown in FIG. 5.

FIG. 6 is a flowchart showing the process executed by the classification control unit according to the second example shown in FIG. 5. The process flow shown in FIG. 6 is the same as the one shown in FIG. 4 except that the step 1 of supplying the class 1 substrate P1.

The second example has the substrate supply/carry-out units for the respective grades. The second example is advantageous to have the possibility of mixing the mounted substrates is lower than the case of the first example.

The first and the second examples employ a serial processing in which the class 2 process is executed after completion of the class 1 process for the purpose of preventing mixing of the mounted substrates. However, the serial processing does not have to be executed so long as the mixing problem is solved.

The first embodiment has been described with respect to the wafer with two grades. However, the grading process may be executed in spite of the wafer with three grades by mounting the class 3 dies D3 after completion of mounting the class 2 dies D2 in the same manner. Therefore, the wafer with four or more grades may also be processed.

(Second Embodiment)

Figure 7:
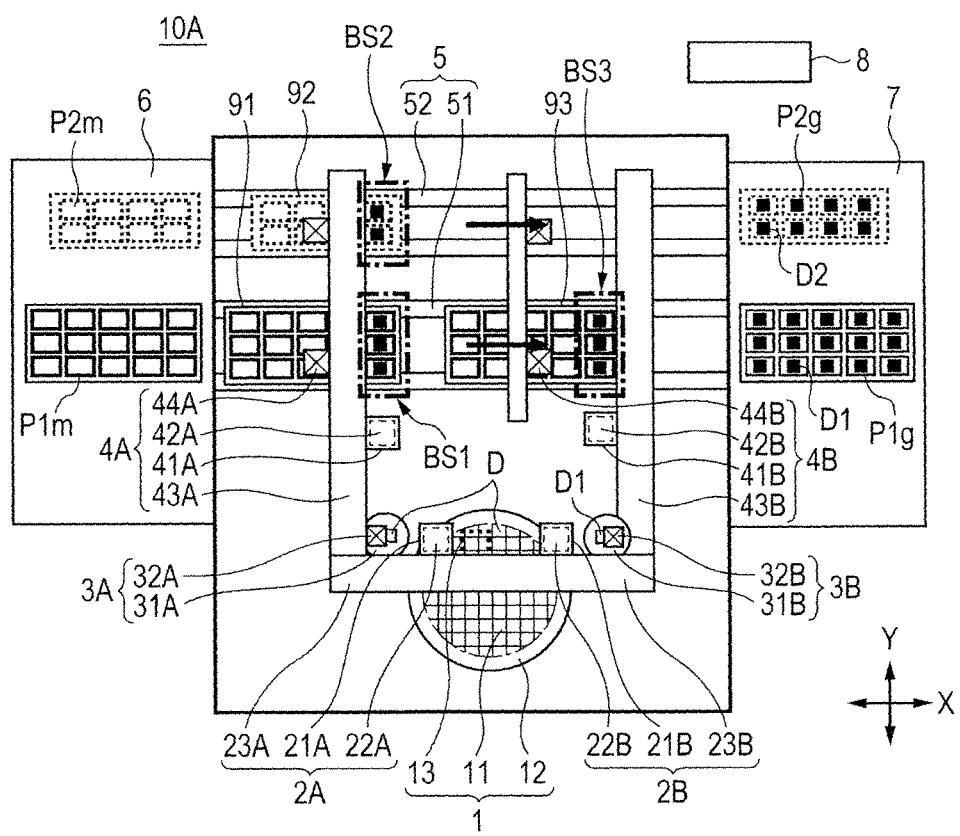
FIG. 7 is a top view schematically representing the die bonder according to a second embodiment of the present invention.

FIG. 7 is a top view schematically showing a die bonder 10A according to a second embodiment of the present invention. The die bonder 10A includes a plurality of conveyance lanes (two in the second embodiment) and a plurality of bonding heads (two in the second embodiment). The first difference between the die bonder 10A and the die bonder 10 is that the conveyance unit 5 of the die bonder 10A has two conveyance lanes 51 and 52. The second difference is that the die bonder 10A has two mount units 20A and 20B each formed of the pickup unit 2, the alignment unit 3 and the bonding unit 4. Each code of the respective mount units 20A and 20B includes the one that denotes the same structure or function as that of the die bonder 10, and the suffix A or B indicating each line. That is, the die bonder 10A includes a plurality of conveyance lanes 51 and 52, and a plurality of bonding heads 41A and 41B. As the operations of the bonding heads and the pickup heads which constitute the mount units 20A and 20B according to the second embodiment are the same as those of the first embodiment, all the operations of the mount unit will be expressed compehensively, for example, as "mounted in the mount unit" for the purpose of simplifying the explanation so long as no problem occurs.

The third difference is that the pickup heads 21A and 21B of the die bonder 10A pick up the dies D from the wafer 11, and move in the X direction to place the dies D on alignment stages 31A and 31B provided at an intersection of trajectories of the bonding heads 41A and 41B.

The die bonder is provided with substrate conveyance pallets 91, 92 and 93, and bonding stages BS1, BS2 and BS3.

Likewise the first embodiment, the second embodiment makes each moving distance of the bonding heads 41A and 41B short, and includes the alignment stages 31A and 31B for reducing the processing time. However, the die D may be picked up from the wafer directly by the bonding head 41 without providing the alignment stages 31A and 31B.

The first characteristic of the second embodiment is the classification control unit or classification control step capable of efficiently operating two lines of the mount units on one of the two conveyance lanes.

As a result, the die bonder with two conveyance lanes and two bonding heads is capable of efficiently performing the grade processing of the wafer without being removed.

The second characteristic is that the classification control unit or the classification control step which returns the class die D (class substrate P) at least at one side to the supply side on at least one of the two conveyance lanes for carry out as described in the first embodiment.

As a result, the die bonder with two conveyance lanes and two bonding heads is capable of performing the grade processing although the wafer has two to four grades (classes) or the wafer has two types of dies with two corresponding grades (classes).

(Third Example)

A structure and an operation of the classification control unit as a third example according to the second embodiment of the present invention will be described referring to FIG. 7. Likewise the first and the second examples, the third example with two conveyance lanes is capable of performing the grade processing when the wafer 11 has two grades.

For this, the third example includes the classification control unit capable of efficiently operating two lines of the mount units on one of the two conveyance lanes.

According to the third example, as indicated by the black arrow mark shown in FIG. 7, the class 1 substrate P1 and the class 2 substrate P2 are conveyed from the substrate supply/carry-out unit 6 to the substrate supply/carry-out unit 7 on the conveyance lane 51 and the conveyance lane 52, respectively via the bonding stages BS1 to BS3. In this case, the substrates are managed for each of the conveyance lanes for the purpose of avoiding mixing of the class 1 substrates and the class 2 substrates. According to the third example, in order to constantly operate the mount units 20A and 20B for improving the operation rates, the dies D are picked up from the wafer 11 alternately. According to the third example, the mount unit 20B mounts the class 1 dies D1 on the bonding stage BS3. The mount unit 20A mounts the same number of the dies as those mounted by the mount unit 20B so as to be processed on the bonding stages BS1 and BS2 at a predetermined rate between the mount of the class 1 dies D1 and the mount of the class 2 dies D2, respectively.

The predetermined rate is inevitably defined in accordance with the rate of the class 2 die D2. For example, if the rate of the class 2 die D2 is set to 10%, 50% out of 90% of the class 1 dies D1 will be processed by the mount unit 20B, and 40% out of 90% of the class 1 dies D1, and 10% of the class 2 dies D2 will be processed by the mount unit 20A.

The classification control unit is allowed to pick up the dies alternately by the mount units 20A and 20B to improve the operation rates, and to allow efficient grade processing.

Three types of methods may be used for allowing the mount unit 20A to execute the process at the predetermined rate.

With the first method so called a separate mount method, the class 1 dies D1 are mounted until no dies are left, and then the class 2 dies D2 are mounted as described in the first and the second examples. With this method, the mount unit 20A mounts the class 1 dies D1 on the bonding stage BS1 first, which are subjected to the processing at the predetermined rate. Then the class 2 dies D2 are mounted on the bonding stage BS2. Meanwhile, the mount unit 20B mounts the class 1 dies D1 that are constantly processed on the bonding stage BS3.

With the second method so called mixed mount method, the mount unit 20A constantly subjects the dies easy to be picked up in a preferential manner. The rate of the class 2 dies D2 to the class 1 dies D1 for mounting may change with times, and is eventually converged to the predetermined rate. The second method allows each of the mount units 20A and 20B to process the same number of dies. The mount unit 20B that processes only the class 1 dies D1 is capable of processing on a substrate conveyance pallet 93 faster than the process executed by the mount unit 20A on the substrate conveyance pallet 91. If the mount unit 20B is kept in a stand-by state until completion of the process of the substrate conveyance pallet 91 executed by the mount unit 20A, the operation rate is reduced. The general operation rate is increased by alternately picking up the dies. For this, so called move-forward method is employed by moving the substrate conveyance pallet 91 on which all the class 1 substrates P1 existing on the bonding stage BS1 are not finished yet to the bonding stage BS3 so that the new substrate conveyance pallet 91 is supplied to the bonding stage BS1.

In the case where the rate of the class 2 dies D2 is low, and the process of the substrate conveyance pallet 93 is finished on the bonding stage BS3, when movement of the substrate conveyance pallet 91 is not effective, the mount unit 20B may be brought into the stand-by state.

The third method is called a rate retention method that retains the aforementioned rates with respect to the predetermined time or the predetermined number of dies. In this case, the move-forward method described relative to the mixed mount method may be employed.

Meanwhile, on the conveyance lane 52, through any method, the mount unit 20A carries out the substrate conveyance pallet 92 to the substrate supply/carry-out unit 7 upon completion of the process of all the class 2 substrates on the substrate conveyance pallet 92 independently of the conveyance lane 51. The substrate conveyance pallet 92 having the unprocessed substrates is then newly supplied to the bonding stage BS2.

A separate mount method is effective for easy classification of the product, that is, easy grade management because of low possibility that the mounted substrates are mixed. Meanwhile, the mixed mount method allows efficient die pickup process, thus reducing the processing time. The rate retention method is effective for execution of the process of the class 1 substrates and the class 2 substrates at the stabilized rates.

Figure 8:
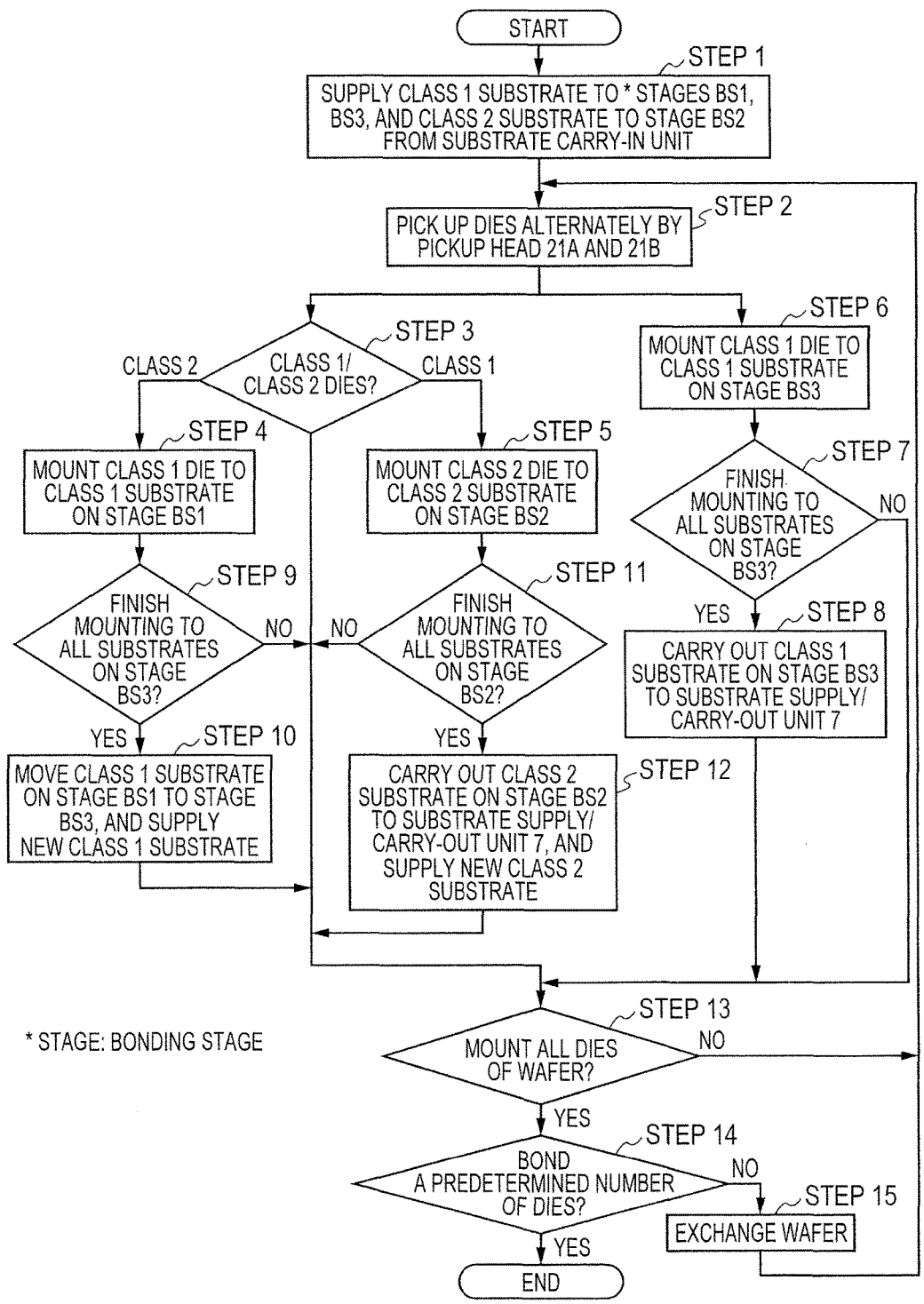
FIG. 8 is a flowchart representing a process flow executed by the classification control unit through a mixed mounting method with a complicated flow.

FIG. 8 is a flowchart of the process steps executed by the classification control unit through the mixed mount method with the complicated flow.

From the substrate supply/carry-out unit 6, the class 1 substrate P1m having no class 1 die D1 mounted as indicated by the solid line is supplied to the bonding stages BS1 and BS3, and the class 2 substrate P2m having no class 2 die D2 mounted as indicated by the broken line is supplied to the bonding stage BS2 (step 1). The mount units 20A and 20B pick up the dies D alternately from the wafer 11 based on the classification map of the dies on the wafer (step 2). It is judged whether the die picked up by the mount unit 20A is the class 1 die or the class 2 die (step 3). Based on the judgment result, the die is mounted onto the bonding stage BS1 or BS2 (steps 4, 5). Meanwhile, the mount unit 20B mounts the class 1 dies D1 onto the bonding stage BS3 unconditionally (step 6).

It is judged whether the class 1 dies D1 have been mounted onto all the class 2 substrates P2m placed on the substrate conveyance pallet 93 which exists on the bonding stage BS3 (step 7). If the judgment is positive, the class 2 substrate P2 on the bonding stage BS3 is carried out to the substrate supply/carry-out unit 7, and the process proceeds to step 13 (step 8). If the judgment is negative, the process proceeds to step 13.

Meanwhile, it is judged whether the class 1 dies D1 have been mounted on all the class 1 substrates P1m on the bonding stage BS3 with slight delay (step 9). If the judgment is positive, the class 1 substrate P1g on the bonding stage BS1 is moved to the bonding stage BS3, and the new class 1 substrate P1m is supplied to the bonding stage BS1 (step 10). If the judgment is negative, the process proceeds to step 13. After mounting the class 2 dies D2, it is judged whether the class 2 dies D2 have been mounted on all the class 2 substrates P2m on the bonding stage BS2 (step 11). If the judgment is positive, the class 2 substrate P2g on the bonding stage BS2 is carried out to the substrate supply/carry-out unit 7, and the new class 2 substrate P2m is supplied to the bonding stage BS2. The process then proceeds to step 13 (step 12). If the judgment is negative, the process proceeds to step 13.

In step 13, it is judged whether all the dies D on the wafer 11 have been mounted. If the judgment is negative, the process proceeds to step 2. If the judgment is positive, it is further judged whether a predetermined number of dies D have been mounted (step 14). If the judgment is negative, the wafer 11 is replaced with a new one, and the process proceeds to step 2. If the judgment is positive, the process ends.

(Fourth Example)

Figure 9:
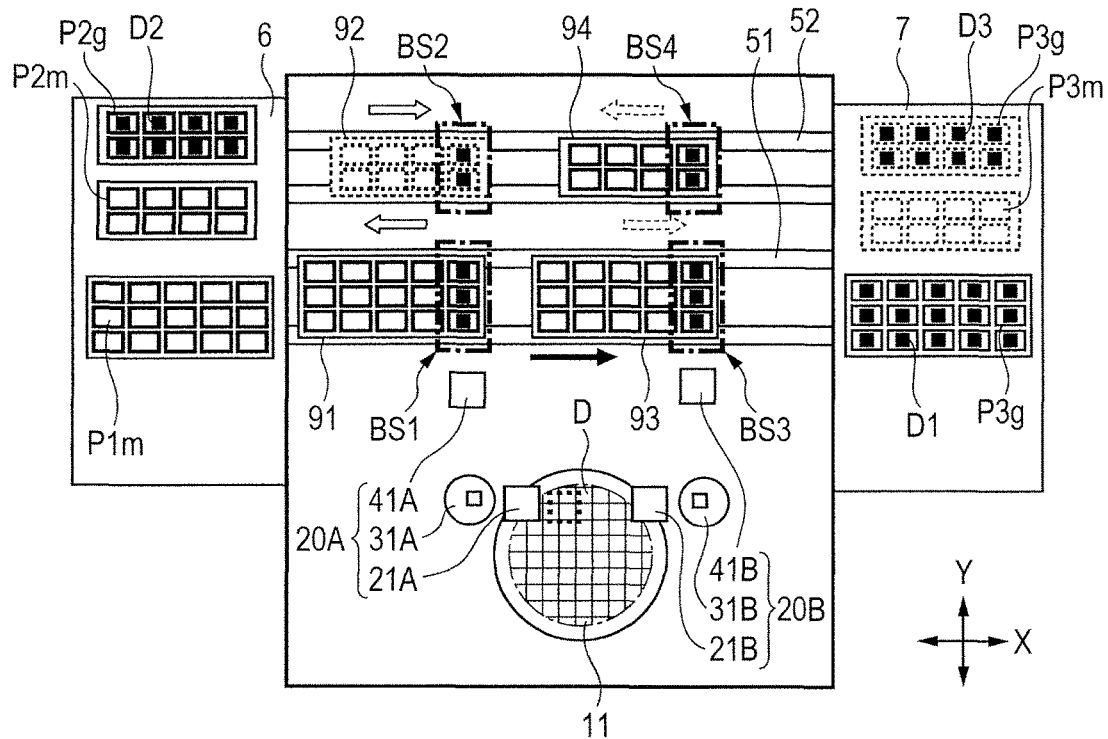
FIG. 9 is a view representing a structure and an operation of the classification control unit as a fourth example according to the second embodiment of the present invention.

A structure and an operation of a classification control unit as a fourth example according to the second embodiment of the present invention will be described referring to FIG. 9. Unlike the first to the third examples, the fourth example is described with respect to the wafer 11 with three grades.

The fourth example includes a classification control unit that supplies the substrates P classified by the respective classes, on which the dies D with two grades are mounted from the supply side, and returns them to the supply side for carry out on the conveyance lane 52 as one of the two conveyance lanes. The fourth example further includes the classification control unit capable of efficiently subjects the wafer 11 with three grades to the grade processing without removing the wafer 11.

According to the fourth example, the class 1 substrate P1m indicated by the solid line, on which the class 1 die D1 is mounted is supplied from the substrate supply/carry-out unit 6 to the conveyance lane 51. Likewise the third example, the mount unit 20A mounts the class 1 die D1 on the bonding stage BS1, and the mount unit 20B mounts the class 1 die D1 on the bonding stage BS3, respectively. When the dies D have been mounted on all the substrates P placed on the respective substrate conveyance pallet 91 or 93, the class 1 substrates P1m on the substrate conveyance pallet 91 or 93 are carried out to the substrate supply/carry-out unit 7 that is different from the substrate supply/carry-out unit 6 as the supply side as indicated by the black arrow mark.

Meanwhile, on the conveyance lane 52, the unmounted class 1 substrate P2m indicated by the solid line, on which the class 2 die D2 is mounted is supplied from the substrate supply/carry-out unit 6, and the unmounted class 3 substrate P3m indicated by the broken line, on which the class 3 die D3 is mounted is supplied from the substrate supply/carry-out unit 7. The mount unit 20A mounts the class 2 die D2 on the unmounted class 2 substrate P2m on the bonding stage BS2, and the mount unit 20B mounts the class 3 die D3 onto the unmounted class 3 substrate P3m on the bonding stage BS4. When the dies D have been mounted on all the substrates P placed on the respective substrate conveyance pallet 92 or 94, the class 2 substrates P2m on the substrate conveyance pallet 92 are returned to the substrate supply/carry-out unit 6 as the supply side indicated by a white arrow mark, and the unmounted class substrates P4m on the substrate conveyance pallet 94 are returned to the substrate supply/carry-out unit 7 as the supply side indicated by a broken line arrow mark, respectively for carry out.

In the fourth example, the dies are supplied to the mount units 20A and 20B, alternately to allocate them so that the process executed by the mount unit 20A becomes the same as the one executed by the mount unit 20B. For example, assuming that the rates among the class 1, class 2 and class 3 are set to 70%, 20% and 10%, respectively, 30% out of 70% of the class 1 is mounted on the bonding stage BS1, 20% of the class 2 is mounted on the bonding stage BS2, 40% out of 70% of the class 1 is mounted on the bonding stage BS3, and 10% of the class 3 is mounted on the bonding stage BS4, respectively.

The separate mount method, mixed mount method or the rate retention method as described relative to the third example may be employed for the fourth example.

When the mixed mount method is employed for the fourth example, the branch flow in step 3 and subsequent steps executed by the mount unit 20A in the process flow shown in FIG. 8 is added to the process step executed by the mount unit 20B. Depending on the allocation of the class 1, the substrate conveyance pallet 93 on the bonding stage BS3 is not always processed preferentially. For this, the process having the rate of the class on the bonding stage BS4 lower than that of the class on the bonding stage BS2 is selected. In other words, the rate of the class 1 on the bonding stage BS3 is made higher than the rate of the class 1 on the bonding stage BS1. The process rate of the mount unit 20A may be controlled so that the substrate conveyance pallet 93 on the bonding stage BS3 is processed preferentially. Depending on circumstances, the rate retention method is thoroughly employed.

(Fifth Example)

Figure 10:
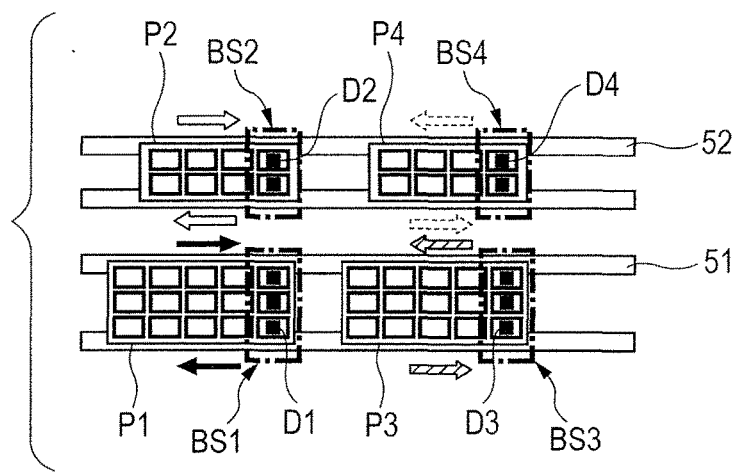
FIG. 10 is a view representing a structure and an operation of the classification control unit as a fifth example according to the second embodiment of the present invention.

A structure and an operation of a classification control unit as a fifth example according to the second embodiment of the present invention will be described referring to FIG. 10. Unlike the first to the fourth examples, the fifth example has the wafer 11 with four grades, or two types of dies with two grades, respectively.

The fifth example includes a classification control unit that returns the class dies D on at least one of the two conveyance lanes to the supply side for carry out. The fifth example further includes a classification control unit capable of efficiently executing the grade processing in the case where the wafer 11 has four grades, or two types of dies have two grades, respectively without removing the wafer.

The fifth example has the same structure as that of the fourth example. FIG. 10 briefly illustrates the structure while focusing on the difference with respect to the process on the bonding stages BS1 and BS3. As black, white, broken line and shaded arrow marks are shown in FIG. 10, the class 1 substrate P1 to the class 4 substrate P4 are controlled to return to the supply positions at the end of the mounting so that each process on the bonding stage BS is independently executed.

The bonding stages BS are arranged so that the rate of the process to be executed by the mount unit 20A becomes the same as the one executed by the mount unit 20B. In the case where two types of dies have two grades, respectively, and the processing rates on the bonding stages BS are set to 44%, 35%, 12%, and 9% in descending order, the allocation to the mount units 20A and 20B is performed to set the combinations of (44%, 9%) and (35%, 12%). In this example, there is the difference in the processing amount between the mount units 20A and 20B by 6%. For the purpose of solving the difference, the processing may be replaced at an intermediate point although the resultant management of the mount substrate becomes complicated.

According to the example, in the case where the wafer 11 has four grades, or two types of dies have two grades, respectively, the die bonder with two conveyance lanes is allowed to execute the grade processing.

As described above, the second embodiment has two conveyance lanes. However, three conveyance lanes may be employed to allow the process to be executed in the same manner. For example, if three conveyance lanes are employed, the mount unit 20A covers three grades (classes), and the mount unit 20B covers two or three grades. When the dies with different grades are conveyed on the conveyance lane, the same substrate supply/carry-out unit may be used to perform the supply and carry-out operations.

In the description, although the substrate corresponds with the class, the substrate may be kept unchanged in spite of the different class.

The embodiments according to the present invention have been described. It is to be understood that the present invention may be made into an alternative form, corrected, and modified based on the description. The present invention contains an alternative examples, correction or modification as described above within a scope of the present invention.

What is claimed is:

1. A die bonder provided with a classification map of first and second class dies obtained by classifying dies of a single wafer, the dies having first and second grades in accordance with different electric properties, a die supply unit that supplies the wafer, a pickup unit that picks up the dies from the wafer, first and second bonding heads that bond picked up dies onto a substrate or a die that has been already bonded, first and second conveyance lanes that convey first and second class substrates, to which the corresponding first and second class dies are bonded, to a bonding region in a unit of the first and second class substrates, and first, second and third bonding stages; and a classification control unit that bonds the first and second class dies to the corresponding first and second class substrates based on the classification map;

wherein the classification control unit conveys first and second substrate conveyance pallets in series, each of which has a plurality of the first class substrates to which the first class dies are bonded, on the first conveyance lane that conveys the first class dies, the first and second substrate conveyance pallets are carried out from one end to the other end of the first conveyance lane, wherein the classification control unit conveys third substrate conveyance pallet, which has a plurality of the second class substrates to which the second class dies are bonded, on the second conveyance lane that conveys the second class dies, the third substrate conveyance pallet are carried out from one end to the other end of the second conveyance lane, wherein a number of the first class dies to be bonded on the first class substrates is larger than a number of the second class dies to be bonded on the second class substrates, wherein the first and third bonding stages are provided over the first conveyance lane, and the second bonding stage is provided over the second conveyance lane, wherein the first bonding head bonds the first class die on the first class substrate of the first substrate conveyance pallet at the first bonding stage and bonds the second class die on the second class substrate at the second bonding stage, the second bonding head bonds another first class die on the first class substrate of the second substrate conveyance pallet at the third bonding stage, wherein the classification control unit is allowed to pick up the dies alternately by the first and second bonding heads, wherein, when all the first class substrates on the second substrate conveyance pallet to be conveyed in series with first substrate conveyance pallet, which is closer to the other end, are bonded, the classification control unit moves the first substrate conveyance pallet closer to the one end to a position of the second substrate conveyance pallet which is closer to the other end, and wherein the classification control unit picks up the dies so as to establish predetermined rates among the respective classes with respect to a predetermined time or a predetermined number of dies, wherein the first bonding head bonds all of the second class dies and a first portion of the first class dies, and the second bonding head bonds a second portion of the first class dies, wherein a number of dies in a sum of all of the second class dies and the first portion of the first class dies is substantially equal to a number of dies in the second portion of the first class dies.

2. The die bonder according to claim 1, wherein the classification control unit moves the first substrate conveyance pallet from the first bonding stage to the third bonding stage even if all the first class die bonding on the first bonding stage are not finished yet so that a new substrate conveyance pallet is supplied to the first bonding stage.

3. The die bonder according to claim 1, wherein the first conveyance lane is located between the second conveyance lane and the die supply unit.

4. The die bonder according to claim 3, further comprising:
- a first pickup head and a second pickup head corresponding to the first and second bonding heads; and
- a first alignment stage and a second alignment stage corresponding to the first and second pick up heads,
- wherein both of the first and second bonding heads pick up the die from both of the first and second alignment stages, and
- wherein the first conveyance lane is located between the second conveyance lane and the first and second alignment stage.

5. The die bonder according to claim 1, wherein on the second conveyance lane, the classification control unit carries out the third substrate conveyance pallet upon completion of the process of all the second class substrates on the third substrate conveyance pallet independently of the first conveyance lane, the third substrate conveyance pallet having the unprocessed substrates is then newly supplied to the second bonding stage.

6. A bonding method of a die bonder with first and second conveyance lanes, first and second bonding stages, and first and second bonding heads, comprising:
- map generation step of generating a classification map of first and second class dies of a single wafer, which have first and second grades in accordance with different electric properties;
- pickup step of picking up the dies from the wafer;
- bonding step of bonding the dies picked up onto a substrate or an already bonded die;
- conveying step of conveying each of first and second class substrates, to which the corresponding first and second class dies are bonded, on the first and second conveyance lanes to a bonding region in a unit of the first and second class substrates; and
- a classification control step of bonding the first and second class dies to corresponding class substrates based on the classification map,
- wherein the classification control step conveys first and second substrate conveyance pallets in series, each of which has a plurality of the first class substrates to which first class dies are bonded, on the first conveyance lane that conveys the first class dies, the first and second substrate conveyance pallets are carried out from one end to another end of the first conveyance lane,
- wherein the classification control step conveys third substrate conveyance pallet, which has a plurality of the second class substrates to which the second class dies are bonded, on the second conveyance lane that conveys the second class dies, the third substrate conveyance pallet are carried out from one end to the other end of the second conveyance lane,
- wherein a number of the first class dies to be bonded on the first class substrates is larger than a number of the second class dies to be bonded on the second class substrates,
- wherein the first and third bonding stages are provided over the first conveyance lane, and the second bonding stage is provided over the second conveyance lane,
- wherein the classification control step bonds the first class die on the first class substrate of the first substrate conveyance pallet at the first bonding stage and the second class die on the second class substrate at the second bonding stage by the first bonding head, and bonds another first class die on the first class substrate of the second substrate conveyance pallet at the third bonding stage by the second bonding head,
- wherein the classification control step picks up the dies alternately by the first and the second bonding heads,
- wherein, when all the first class substrates on the second substrate conveyance pallet to be conveyed in series with first substrate conveyance pallet, which is closer to the other end, are bonded, the classification control step moves the first substrate conveyance pallet closer to the one end to a position of the second substrate conveyance pallet which is closer to the other end, and
- wherein the classification control step picks up the dies so as to establish predetermined rates among the respective classes with respect to a predetermined time or a predetermined number of dies, wherein the first bonding head bonds all of the second class dies and a first portion of the first class dies, and the second bonding head bonds a second portion of the first class dies, wherein a number of dies in a sum of all of the second class dies and the first portion of the first class dies is substantially equal to a number of dies in the second portion of the first class dies.

7. The bonding method according to claim 6, wherein the classification control step moves the first substrate conveyance pallet from the first bonding stage to the third bonding stage even if all the first class die bonding on the first bonding stage are not finished yet so that a new substrate conveyance pallet is supplied to the first bonding stage.

8. The bonding method according to claim 6, wherein the first conveyance lane is located between the second conveyance lane and the die supply unit.

9. The bonding method according to claim 8, further comprising:
- a first pickup head and a second pickup head corresponding to the first and second bonding heads; and
- a first alignment stage and a second alignment stage corresponding to the first and second pickup heads,
- wherein both of the first and second bonding heads pick up the die from both of the first and second alignment stages, and
- wherein the first conveyance lane is located between the second conveyance lane and the first and second alignment stage.

10. The bonding method according to claim 6, wherein on the second conveyance lane, the classification control step carries out the third substrate conveyance pallet upon completion of the process of all the second class substrates on the third substrate conveyance pallet independently of the first conveyance lane, the third substrate conveyance pallet having the unprocessed substrates is then newly supplied to the second bonding stage.

* * * * *